United States Patent [19]

Camilletti et al.

[11] Patent Number: 5,753,374
[45] Date of Patent: May 19, 1998

[54] PROTECTIVE ELECTRONIC COATING

[75] Inventors: Robert Charles Camilletti; Loren Andrew Haluska; Keith Winton Michael, all of Midland, Mich.

[73] Assignee: Dow Corning Corporation, Midland, Mich.

[21] Appl. No.: 563,255

[22] Filed: Nov. 27, 1995

[51] Int. Cl.$^6$ .......................................................... B32B 9/04
[52] U.S. Cl. .......................... 428/446; 428/451; 428/698; 428/699; 428/701; 428/702; 437/235; 437/238; 437/240; 427/372.2; 427/397.7; 427/402; 427/419.4
[58] Field of Search .................................. 428/446, 451, 428/698, 699, 701, 702; 437/238, 235, 240; 427/372.2, 397.7, 402, 407.1, 419.1, 419.8, 419.4

[56] References Cited

U.S. PATENT DOCUMENTS

| | | |
|---|---|---|
| 3,615,272 | 10/1971 | Collins .................................. 423/325 |
| 4,749,631 | 6/1988 | Haluska et al. ........................ 428/704 |
| 4,756,977 | 7/1988 | Haluska et al. ........................ 428/704 |
| 4,999,397 | 3/1991 | Weiss ...................................... 524/755 |
| 5,010,159 | 4/1991 | Bank ........................................ 528/23 |
| 5,399,441 | 3/1995 | Bearinger ............................... 428/689 |
| 5,436,083 | 7/1995 | Haluska .................................. 428/688 |
| 5,481,135 | 1/1996 | Chandra ................................. 257/701 |
| 5,516,596 | 5/1996 | Camilletti ............................... 428/698 |

FOREIGN PATENT DOCUMENTS 560485 of 0000 European Pat. Off. .

*Primary Examiner*—Timothy Speer
*Attorney, Agent, or Firm*—Sharon K. Severance

[57] ABSTRACT

A method for forming a cap on an electronic device to prevent inspection. First, a silica-containing ceramic is applied to the surface the electronic device to planarize the surface. Next, a silicon carbide coating is applied to the surface of the silica containing ceramic to form a hermetic barrier. A layer of porous silica-containing ceramic is then formed on the surface of the silicon carbide coating. Finally, the porous silica-containing ceramic is impregnated with an opaque material.

31 Claims, No Drawings

PROTECTIVE ELECTRONIC COATING

BACKGROUND

The present invention relates to a series of coatings used on electronic devices for hermetic protection and to inhibit examination and/or reverse engineering of the underlying device.

The use of silica-containing ceramic coatings on substrates such as electronic devices is known in the art. For instance, Haluska et al. in U.S. Pat. Nos. 4,749,631 and 4,756,977 disclose processes for forming silica coatings on electronic substrates wherein solutions of silica precursor resins are applied to substrates followed by heating the coated substrates in air at a temperature in the range of 200°–1000° C. These references also describe the use of additional ceramic coatings on the silica-containing ceramic. These references, however, do not describe the series of protective coatings claimed in the present invention.

European Publication 560,485 teaches the use of porous ceramic coatings impregnated with silicone polymers as protective coatings on electronic devices. The reference, however, fails to teach the use of the series of coating claimed herein and it fails to teach the use opaque materials which inhibit inspection of the device.

The present inventors now claim a multilayer coating which can be used for hermetic protection and to protect electronic devices from inspection.

SUMMARY OF THE INVENTION

The present invention relates to a method for forming a protective coating on an electronic device. The method comprises first applying a hydrogen silsesquioxane resin to the surface of an electronic device followed by heating the hydrogen silsesquioxane resin to a temperature sufficient to convert it into a silica-containing ceramic. Next, a silicon carbide coating is applied to the surface of the silica containing ceramic by a chemical vapor deposition process. A layer of porous silica-containing ceramic is then formed on the surface of the silicon carbide coating by applying a hydrogen silsesquioxane resin and then heating the hydrogen silsesquioxane resin to a temperature sufficient to convert it into a porous silica-containing ceramic. Finally, the porous silica-containing ceramic is impregnated with a substance comprising an opaque material.

DETAILED DESCRIPTION OF THE INVENTION

The present invention teaches the use of a series of ceramic coatings on electronic devices for hermetic protection and to prevent inspection of the device. The coatings comprise a silica-containing ceramic, an amorphous silicon carbide ceramic and a porous silica-containing ceramic with an opaque material within its pores. The first silica-containing layer and the silicon carbide layer of this invention planarize and hermetically seal the device. The porous silica-containing ceramic layer with the opaque material within its pores inhibits inspection of the device. Moreover, etching though such a layer is very difficult due to the variation in density.

In the present invention the 'porous silicon-containing ceramic' is one which contains voids of a sufficient size to allow infiltration of the opaque material. Such voids can include pores, pinholes, cracks, etc.; and an 'electronic device' or 'electronic circuit' includes, but is not limited to, silicon based devices, gallium arsenide based devices, focal plane arrays, opto-electronic devices, photovoltaic cells and optical devices.

The first step in the process of the present invention involves applying a hydrogen silsesquioxane resin to the surface of an electronic device followed by heating the hydrogen silsesquioxane resin to a temperature sufficient to convert it into a silica-containing ceramic.

Hydrogen silsesquioxane resin is used in this invention to describe a variety of hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, $x=0-2$, $y=0-2$, $z=1-3$, $x+y+z=3$. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si—OR) and/or partially condensed (i.e., containing some Si—OH). Although not represented by this structure, these resins may contain a small number (eg., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

The hydrogen silsesquioxane resin can be formed into the desired coating by any practical technique known in the art. In a preferred method, a solution comprising a solvent and the hydrogen silsesquioxane resin is applied to the electronic device and the solvent is then evaporated. Such a solution could be formed, for example, by simply dissolving or dispersing the hydrogen silsesquioxane resin in a solvent or mixture of solvents such as aromatic hydrocarbons (eg., benzene or toluene), alkanes (eg., n-heptane or dodecane), ketones, cyclic dimethylpolysiloxanes, esters or ethers. Generally, enough solvent is used to form a 0.1–85 (preferably 5–30) weight percent solution.

If desired, other materials may be added to the hydrogen silsesquioxane resin solution. The can include, for example, other preceramic materials (eg., other preceramic polymers or precursors to various oxides such as aluminum, titanium, zirconium, tantalum, niobium, vanadium, boron or phosphorous at 0.1 to 50 wt. %), catalysts (eg., platinum, rhodium or copper at 5 and 500 ppm based on the weight of resin) or fillers.

The hydrogen silsesquioxane resin solution can then be coated onto the electronic device by, for example, spin coating, dip coating, spray coating or flow coating followed by evaporating the solvent to form a preceramic coating.

Although the solution approach is specifically described, one skilled in the art would recognize that other equivalent means such a melt coating would also function herein and are contemplated to be within the scope of this invention.

The hydrogen silsesquioxane resin is then converted into a silica-containing coating by heating it to a temperature sufficient for ceramification. Generally, the temperature is in the range of about 50° to about 800° C., preferably in the range of about 50° to about 600° C., and more preferably 100°–450° C. The time used for such heating is a time sufficient to form the silica-containing ceramic, generally up to about 6 hours, with a range of between about 5 minutes and about 3 hours being preferred.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$, H etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

The resultant silica-containing ceramic planarizes the surface of the electronic device for the additional coatings to be applied. The coating can contain amorphous silica ($SiO_2$) and amorphous silica-like materials that are not fully free of residual carbon, silanol (Si—OH) and/or hydrogen. The coating can be porous or condensed based on the temperature used for ceramification.

A silicon carbide coating is next applied to the surface of the silica-containing coating. The Method of applying the silicon carbide is not critical to the invention and many are known in the art. Examples of applicable methods include a variety of chemical vapor deposition techniques such as thermal CVD, photochemical vapor deposition, plasma enhanced chemical vapor deposition (PECVD), electron cyclotron resonance (ECR), jet vapor deposition, etc. and a variety of physical vapor deposition techniques such as sputtering, electron beam evaporation, etc. These processes involve either the addition of energy (in the form of heat, plasma, etc.) to a vaporized species to cause the desired reaction or the focusing of energy on a solid sample of the material to cause its deposition.

In thermal chemical vapor deposition, the coating is deposited by passing a stream of the desired precursor gases over a heated substrate. When the precursor gases contact the hot surface, they react and deposit the coating. Substrate temperatures in the range of about 100°–1000° C. are sufficient to form these coatings in several minutes to several hours, depending on the precursors and the thickness of the coating desired. If desired, reactive metals can be used in such a process to facilitate deposition.

In PECVD, the desired precursor gases are reacted by passing them through a plasma field. The reactive species thereby formed are then focused at the substrate where they readily adhere. Generally, the advantage of this process over thermal CVD is that lower substrate temperature can be used. For instance, substrate temperatures of about 50° C. up to about 600° C. are functional.

The plasma used in such processes can comprise energy derived from a variety of sources such as electric discharges, electromagnetic fields in the radio-frequency or microwave range, lasers or particle beams. Generally preferred in most plasma deposition processes is the use of radio frequency (10 kHz–$10^2$ MHz) or microwave (0.1–10 GHz) energy at moderate power densities (0.1–5 watts/cm$^2$). The specific frequency, power and pressure, however, are generally tailored to the precursor gases and the equipment used.

The precursor gases are also not critical to the invention. Examples of suitable precursor gases include (1) mixtures of silane or a halosilane such as trichlorosilane in the presence of an alkane of one to six carbon atoms such as methane, ethane, propane, etc.; (2) an alkylsilane such as methylsilane, dimethylsilane, trimethylsilane and hexamethyldisilane; or (3) a silacyclobutane or disilacyclobutane as further described in U.S. Pat. No. 5,011,706, which is incorporated herein in its entirety. Especially preferred in the present invention is the plasma enhanced chemical vapor deposition of trimethylsilane.

The resultant silicon carbide coating forms a hermetic and electrical barrier over the surface of the chip. It inhibits damage from chemical and mechanical means.

A porous silica-containing ceramic coating is next applied on the surface of the silicon carbide coating. This coating is formed in essentially the same manner as the first silica-containing coating. Specifically, a hydrogen silsesquioxane resin is applied to the surface of an electronic device followed by heating the hydrogen silsesquioxane resin to a temperature sufficient to convert it into a silica-containing ceramic.

The heating process for forming the porous silica-containing ceramic, however, should be controlled to insure that it remains porous. Specifically, at a temperature of about 600° C. the silica-containing ceramic is converted into relatively dense quartz when heated for a sufficient time. Therefore, the heating of the second hydrogen silsesquioxane resin coating should be controlled so that the coating is not heated above 600° C. or, alternatively, if the coating is heated above 600° C. the heating time should be limited to less than 30 minutes.

The resultant coating is a silica-containing porous ceramic. Generally, such coatings can contain up to about 25–30% porosity. Such a ceramic serves as an excellent support for opaque materials.

The resultant porous ceramic coating is then infiltrated with an opaque material. As used herein, the expression "opaque material" is meant to include optically opaque materials (materials which inhibit transmission of at least about 90% of visual light (i.e., they are not transparent by visual inspection of the human eye under normal lighting), radiopaque materials (materials which inhibit transmission of at least about 90% of a specific type of radiation such as microwave, x-ray, UV, and IR or sound waves) and mixtures thereof.

Examples of specific materials include organic polymers such as polyimides, epoxies, polybenzocyclobutanes and the like, inorganic polymers such as phosphorous oxynitride and the like, dyes such as crystal violet, pseudocyanine, and the like, low melting point metals such as lead, tin, bismuth, gallium, and the like, fluorocarbon polymers such as polytetrafluoroethylene, vinylidene fluoride, hexafluoropropylene, mixtures of such substances, and the like.

The opaque materials are infiltrated into the silica-containing ceramic coating by known infiltration techniques. For instance, the ceramic may be melt infiltrated, vacuum infiltrated, high pressure infiltrated, or infiltrated by solution or supercritical fluid techniques. After infiltration, any excess material may then be wiped off or left on the surface to provide a thicker coating. If desired or necessary, the opaque material can be adhered in place by, for example, curing, heating etc.

By the above methods, an electronic device is hermetically protected and inspection is inhibited. The first silica-containing coating planarizes and insulates the electronic substrate. The silicon carbide provides hermetic, electrical and mechanical protection. The final silica-containing coating impregnated with the opaque material inhibits examination and it makes it difficult to etch the coating.

If desired, additional coatings may be applied over the impregnated coating. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings.

That which is claimed is:

1. A method for forming a protective coating on an electronic device comprising:
   A. applying a composition comprising hydrogen silsesquioxane resin to the surface of an electronic device;
   B. heating the composition to a temperature sufficient to convert the hydrogen silsesquioxane resin into a silica-containing ceramic;
   C. applying a silicon carbide coating to the surface of the silica containing ceramic by a chemical vapor deposition process;
   D. applying a composition comprising hydrogen silsesquioxane resin to the surface of the silicon carbide coating;
   E. heating the composition to a temperature sufficient to convert the hydrogen silsesquioxane resin into a porous silica-containing ceramic; and
   F. impregnating the porous silica-containing ceramic with a substance comprising an opaque material.

2. The method of claim 1 wherein the composition comprising hydrogen silsesquioxane resin of step A contains a solvent and the hydrogen silsesquioxane is diluted to between about 5 and about 30 wt % solids.

3. The method of claim 1 wherein the composition comprising hydrogen silsesquioxane resin of step D contains a solvent and the hydrogen silsesquioxane is diluted to between about 5 and about 30 wt. % solids.

4. The method of claim 1 wherein the composition comprising hydrogen silsesquioxane resin of step A contains an oxide precursor selected from the group consisting of aluminum oxide precursors, titanium oxide precursors, zirconium oxide precursors, tantalum oxide precursors, niobium oxide precursors, vanadium oxide precursors, boron oxide precursors and phosphorous oxide precursors.

5. The method of claim 1 wherein the composition comprising hydrogen silsesquioxane resin of step D contains an oxide precursor selected from the group consisting of aluminum oxide precursors, titanium oxide precursors, zirconium oxide precursors, tantalum oxide precursors, niobium oxide precursors, vanadium oxide precursors, boron oxide precursors and phosphorous oxide precursors.

6. The method of claim 1 wherein the composition comprising hydrogen silsesquioxane resin of step A contains a catalyst for the hydrogen silsesquioxane resin.

7. The method of claim 1 wherein the composition comprising hydrogen silsesquioxane resin of step D contains a catalyst for the hydrogen silsesquioxane resin.

8. The method of claim 1 wherein the heating of step B is conducted at a temperature in the range of about 50° to about 800° C. for up to about 6 hours.

9. The method of claim 1 wherein the heating of step E is conducted at a temperature in the range of about 50° to about 600° C. for up to about 6 hours.

10. The method of claim 1 wherein the silicon carbide of step C is applied by introducing a source gas into a process selected from the group consisting of thermal chemical vapor deposition, photochemical vapor deposition, plasma enhanced chemical vapor deposition, electron cyclotron resonance and jet vapor deposition.

11. The method of claim 10 wherein the source gas is selected from the group consisting of a mixtures of a silane and an alkane of one to six carbon atoms, an alkylsilane, a silacyclobutane and a disilacyclobutane.

12. The method of claim 1 wherein the silicon carbide is deposited by the chemical vapor deposition of trimethylsilane.

13. The method of claim 1 wherein the opaque material is selected from the group consisting of optically opaque materials, radiopaque materials and mixtures thereof.

14. The method of claim 1 wherein the opaque material is selected from the group consisting of organic polymers, inorganic polymers, dyes, fluorocarbon polymers and mixtures thereof.

15. A manufacture comprising:
   an electronic device;
   a silica-containing ceramic coating on the surface of the electronic device;
   a silicon carbide ceramic coating on the surface of the silica containing ceramic; and
   a porous silica-containing ceramic coating on the surface of the silicon carbide ceramic coating, wherein a substance comprising an opaque material is within the pores of the porous silica-containing ceramic coating.

16. The manufacture of claim 15 wherein the opaque material is selected from the group consisting of optically opaque materials, radiopaque materials and mixtures thereof.

17. The manufacture of claim 15 wherein the opaque material is selected from the group consisting of organic polymers, inorganic polymers, dyes, fluorocarbon polymers and mixtures thereof.

18. An electronic device produced by the method comprising:
   A. applying a composition comprising hydrogen silsesquioxane resin to the surface of an electronic device;
   B. heating the composition to a temperature sufficient to convert the hydrogen silsesquioxane resin into a silica-containing ceramic;
   C. applying a silicon carbide coating to the surface of the silica containing ceramic by a chemical vapor deposition process;
   D. applying a composition comprising hydrogen silsesquioxane resin to the surface of the silicon carbide coating;
   E. heating the composition to a temperature sufficient to convert the hydrogen silsesquioxane resin into a porous silica-containing ceramic; and
   F. impregnating the porous silica-containing ceramic with a substance comprising an opaque material.

19. The electronic device of claim 18 wherein the composition comprising hydrogen silsesquioxane resin of step A contains a solvent and the hydrogen silsesquioxane is diluted to between about 5 and about 30 wt % solids.

20. The electronic device of claim 18 wherein the composition comprising the hydrogen silsesquioxane resin of step D contains a solvent and the hydrogen silsesquioxane is diluted to between about 5 and about 30 wt % solids.

21. The electronic device of claim 18 wherein the composition comprising hydrogen silsesquioxane resin of step A contains an oxide precursor selected from the group consisting of aluminum oxide precursors, titanium oxide precursors, zirconium oxide precursors, tantalum oxide precursors, niobium oxide precursors, vanadium oxide precursors, boron oxide precursors and phosphorous oxide precursors.

22. The electronic device of claim 18 wherein the composition comprising hydrogen silsesquioxane resin of step D contains an oxide precursor selected from the group consisting of aluminum oxide precursors, titanium oxide precursors, zirconium oxide precursors, tantalum oxide precursors, niobium oxide precursors, vanadium oxide precursors, boron oxide precursors and phosphorous oxide precursors.

23. The electronic device of claim 18 wherein the composition comprising hydrogen silsesquioxane resin of step A contains a catalyst for the hydrogen silsesquioxane resin.

24. The electronic device of claim 18 wherein the composition comprising hydrogen silsesquioxane resin of step D contains a catalyst for the hydrogen silsesquioxane resin.

25. The electronic device of claim 18 wherein the heating of step B is conducted at a temperature in the range of about 50° to 800° C. for up to about 6 hours.

26. The electronic device of claim 18 wherein the heating of step E is conducted at a temperature in the range of about 50° to 600° C. for up to about 6 hours.

27. The electronic device of claim 18 wherein the silicon carbide of step C is applied by introducing a source of gas into a process selected from the group consisting of thermal chemical vapor deposition, photochemical vapor deposition, plasma enhanced chemical vapor deposition, electron cyclotron resonance and jet vapor deposition.

28. The electronic device of claim 27 wherein the source of gas is selected from the group consisting of a mixture of silane and an alkane of one to six carbon atoms, an alkylsilane, a silacyclobutane and a disilacyclobutane.

29. The electronic device of claim 18 wherein the silicon carbide is deposited by the chemical vapor deposition of trimethylsilane.

30. The electronic device of claim 18 wherein the opaque material is selected from the group consisting of optically opaque materials and radiopaque materials and mixtures thereof.

31. The electronic device of claim 18 wherein the opaque material is selected from the group consisting of organic polymers, inorganic polymers, dyes, fluorocarbon polymers and mixtures thereof.

* * * * *